United States Patent
Pak (10) Patent No.: US 9,435,827 B2
(45) Date of Patent: Sep. 6, 2016

(54) PROBE-CONNECTION-TYPE POGO PIN AND MANUFACTURING METHOD THEREOF

(71) Applicant: IWIN CO., LTD., Chungcheongbuk-do (KR)

(72) Inventor: Sang-Yang Pak, Chungcheongbuk-do (KR)

(73) Assignee: IWIN CO., LTD., Chungcheongbuk-do (KR)

( * ) Notice: Subject to any disclaimer, the term of this patent is extended or adjusted under 35 U.S.C. 154(b) by 170 days.

(21) Appl. No.: 14/363,111

(22) PCT Filed: Dec. 4, 2012

(86) PCT No.: PCT/KR2012/010435
§ 371 (c)(1),
(2) Date: Jun. 5, 2014

(87) PCT Pub. No.: WO2013/085254
PCT Pub. Date: Jun. 13, 2013

(65) Prior Publication Data
US 2014/0361801 A1 Dec. 11, 2014

(30) Foreign Application Priority Data
Dec. 5, 2011 (KR) .................. 10-2011-0129331
Feb. 14, 2012 (KR) .................. 10-2012-0014662

(51) Int. Cl.
*G01R 31/00* (2006.01)
*G01R 1/067* (2006.01)
(Continued)

(52) U.S. Cl.
CPC ....... *G01R 1/06722* (2013.01); *G01R 1/06733* (2013.01); *G01R 3/00* (2013.01); *H01R 13/2421* (2013.01); *H01R 12/714* (2013.01); *Y10T 29/49208* (2015.01)

(58) Field of Classification Search
CPC .......... G01R 1/07314; G01R 31/2891; G01R 31/2863; G01R 1/07342; H01L 2224/13009

USPC ...................................... 324/755.05
See application file for complete search history.

(56) References Cited

U.S. PATENT DOCUMENTS 5,667,410 A    9/1997   Johnston
6,208,155 B1 *   3/2001   Barabi et al. ........... 324/750.25
(Continued)

FOREIGN PATENT DOCUMENTS

KR    1020070064883 A    6/2007
KR    1020090103738 A    10/2009
(Continued)

OTHER PUBLICATIONS

International Search Report mailed Feb. 28, 2013 for PCT/KR2012/010435.

*Primary Examiner* — Melissa Koval
*Assistant Examiner* — Trung Nguyen
(74) *Attorney, Agent, or Firm* — Hauptman Ham, LLP (57) ABSTRACT

The present invention relates to a pogo pin including a probe part and an elastic part, and more particularly, to a probe-connection-type pogo pin including a cylindrical upper probe part, an elastic part, and a cylindrical lower probe part, which are made in one body, to transmit electrical signals between semiconductor wafers, LCD modules, semiconductor packages, electronic parts such as a variety of sockets, etc. Accordingly, it is possible to reduce the manufacturing process and the manufacturing cost, reduce the outside diameter of the pogo pin by making the elastic part formed to surround the cylindrical lower probe part, and reduce the loss and distortion of electrical signal by allowing the upper probe part and the lower probe part to come in surface contact with each other.

11 Claims, 12 Drawing Sheets

(51) Int. Cl.
  *H01R 13/24* (2006.01)
  *G01R 3/00* (2006.01)
  *H01R 12/71* (2011.01)

(56) References Cited

U.S. PATENT DOCUMENTS

2006/0279301 A1* 12/2006 Treibergs ..................... 324/754

2012/0202390 A1* 8/2012 Park .............................. 439/700

FOREIGN PATENT DOCUMENTS

| KR | 1020100105360 A | 9/2010 |
| KR | 101031634 B1 | 4/2011 |

* cited by examiner

PROBE-CONNECTION-TYPE POGO PIN AND MANUFACTURING METHOD THEREOF

TECHNICAL FIELD

The following description relates to a pogo pin including a probe part and an elastic part, and more particularly, to a probe-connection-type pogo pin including cylindrical upper and lower probe parts and an elastic part, which are made in one body, to transmit electrical signals between semiconductor wafers, LCD modules, semiconductor packages, electronic parts, such as a variety of sockets, etc.

BACKGROUND ART

Spring probe pins, also known as pogo pins, have been widely used in inspection equipment for semiconductor wafers, LCD modules, camera modules, image sensors, and semiconductor packages, a variety of sockets, battery connectors of mobile phones, etc.

Figure 1:
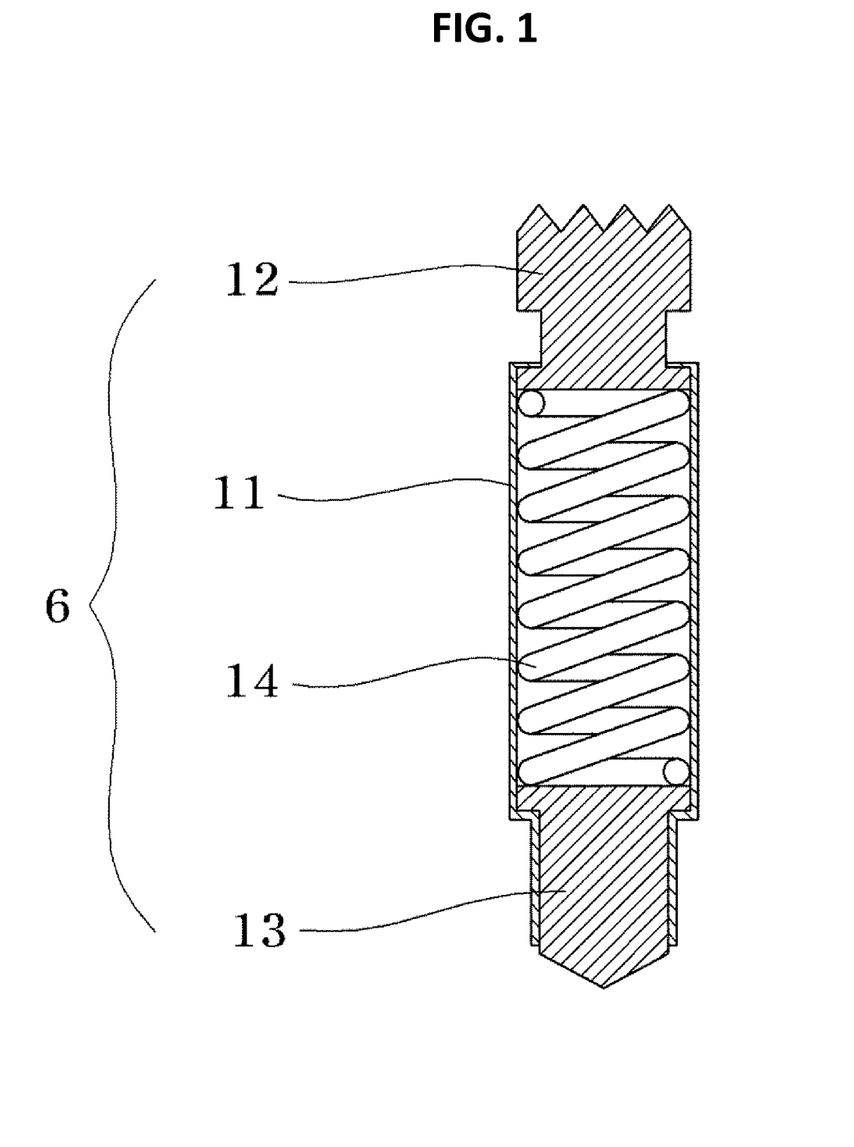
FIG. 1 is a cross-sectional view of a conventional pogo pin.

As shown in FIG. 1, a conventional pogo pin includes an upper probe 12, a lower probe 13, a spring 14, which is formed to apply elastic force on the upper probe 12 and the lower probe 13, and a cylindrical body 11, which contains a lower portion of the upper probe 12, an upper portion of the lower probe 13, and the spring 14.

The respective one ends of the upper probe 12 and the lower probe 13 are engaged with the cylindrical body 11 so that the upper and lower probes may not be detached from the cylindrical body 11. Furthermore, the upper probe 12 and the lower probe 13 are subject to elastic force of the spring 14 which is disposed between the upper probe 12 and the lower probe 13.

Figure 2:
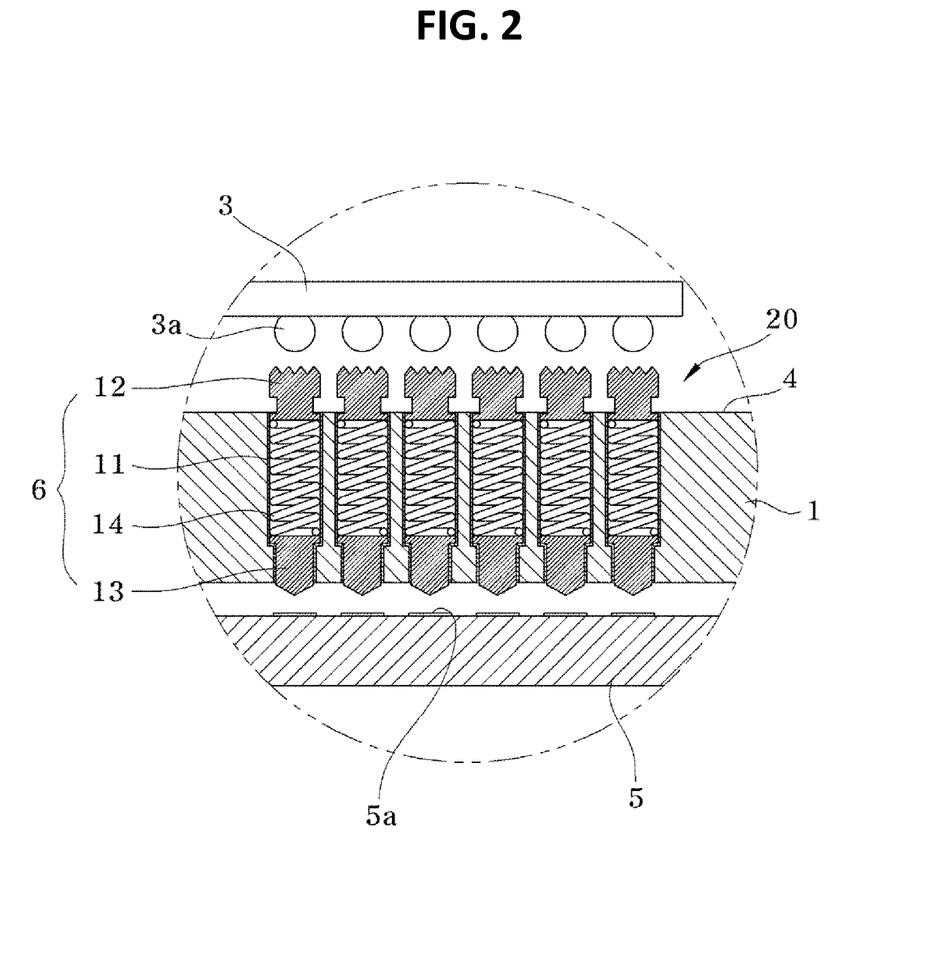
FIG. 2 is a cross-sectional view of a socket for inspection of semiconductor package employing conventional pogo pins.

FIG. 2 is a cross-sectional view of a socket for inspection of semiconductor package in which a plurality of pogo pins are contained in an insulating body. The socket 20 for inspection of semiconductor package includes a plurality of pogo pins 6, and an insulating body 1 which contains the plurality of pogo pins at predetermined intervals. The pogo pins 6 are provided in the insulating body 1 in such a manner that upper probes 12 are projected from a top surface of the insulating body 1 and lower probes 13 are projected from a bottom surface of the insulating body 1 while the pogo pins 6 are spaced apart from one another at the same intervals as those of external terminals 3a of a semiconductor package 3, which come in contact with the upper probes 12, and at the same as those of contact pads 5a of a test board 5, which come in contact with the lower probes 13.

For inspection of the semiconductor package, when the semiconductor package 3 is pressurized, the external terminals 3a of the semiconductor package are brought into contact with the upper probes 12 of the pogo pins 6 and the lower probes 13 are brought into contact with the contact pads 5a of the test board 5. In this case, the upper probes 12 and the lower probes 13 are elastically supported by the springs 14 of the pogo pins 6 to electrically connect the semiconductor package 3 and the test board 5 to each other, thereby enabling an accurate inspection of the semiconductor package.

As shown in FIGS. 1 and 2, the pogo pins need to be positioned at the same intervals as those of the terminals of the semiconductor package. As the semiconductor package becomes increasingly smaller in size, higher in degree of integration, and more efficient in performance, the pogo pin for inspection of the semiconductor package needs to become smaller in size, i.e., in outside diameter, and have a stable, low-impedance transmission path in order to transmit high-frequency electrical signals without distortion. However, the conventional pogo pin is disadvantageous in that the conventional pogo pin is formed in such a manner that the cylindrical body is provided on the outside of the spring. In other words, the conventional pogo pin needs to have an outside diameter as large as both the outside diameter of the spring and the thickness of the cylindrical body containing the spring, which makes it difficult to reduce the outside diameter of the pogo pin to below a predetermined size. Furthermore, since the spring 14 has an electrical path in proportion to the number of turns of the spring 14 and has a spiral structure of a coil causing resistance and inductance components, the spring 14 is not suitable for the electrical path. Accordingly, the conventional pogo pin is disadvantageous in that since the conventional pogo pin has an electrical path through the upper probe 12, the cylindrical body 11, and the lower probe 13, an accurate electrical contact should be maintained at two connection points between the upper probe 12 and the cylindrical body 11 and between the cylindrical body 11 and the lower probe 13.

In addition, the conventional pogo pin is disadvantageous in that the manufacturing process is complex, the manufacturing time is long, and the manufacturing cost increases since the cylindrical body, the upper probe, the lower probe, and the spring are separately manufactured and then the upper probe and the lower probe are combined with the cylindrical body.

DISCLOSURE OF INVENTION

Technical Problem

In order to address the above problems in the related art, the present invention provides a pogo pin with reduced outside diameter and length which is adapted for high performance and high integration, and a method for manufacturing the same.

Additionally, the present invention provides a pogo pin which is manufactured in a simplified manufacturing process for mass production at a significantly low cost, and a method for manufacturing the same.

Furthermore, the present invention provides a method for manufacturing a pogo pin in an efficient manufacturing process sequence to prevent material waste and defective products.

Furthermore, the present invention provides a pogo pin which is formed to reduce loss and distortion of an electrical signal and improve quality of the electrical signal by reducing and simplifying a transmission path of the electrical signal from an upper probe part to a lower probe part or vice versa, and a method for manufacturing the same.

Technical Solution

In one general aspect, there is provided a probe-connection-type pogo pin including an upper probe part, a lower probe part, and an elastic part positioned between the upper probe part and the lower probe part, a) wherein the upper probe part comprises a first body and a tip portion provided on an upper end of the first body, the first body including a hollow cylindrical opening portion on a lower end thereof, b) wherein the lower probe part comprises a second body, a tip portion provided on a lower end of the second body, and an insertion portion provided on an upper end of the second body and having a diameter enough to be inserted into the opening portion, and c) wherein the elastic part is a spring which is formed to surround at least an outside of the insertion portion with one end of the spring fixed to a lower side of the lower probe part and with another end of the spring fixed to a lower end of the upper probe part.

The insertion portion may be circular or a circle with at least one opening when viewed in cross section.

The spring may be a one-directional spring which is only wound in one direction.

The spring may be a two-directional spring whose upper and lower portions are wound in different directions to each other.

The upper probe part or the lower probe part may further comprise a fixing portion.

The upper probe part, the lower probe part, and the elastic part may be made in one body.

The opening portion and the insertion portion may be spaced apart from each other when external force is not applied on the elastic part.

In another general aspect, there is provided a method for manufacturing a probe-connection-type pogo pin including an upper probe part, a lower probe part, and an elastic part positioned between the upper probe part and the lower probe part, the method comprising: a) cutting a metal plate according to planar figures represented on the metal plate, wherein the represented planar figures include a planar figure of upper probe part with a planar figure of tip portion formed on an upper end of the upper probe part, a planar figure of lower probe part with a planar figure of tip portion formed on a lower end of the planar figure of lower probe part, and a planar figure of strip-shaped elastic part formed to connect the planar figure of upper probe part and the planar figure of lower probe part to each other, b) forming a raw pogo pin made of an upper probe part, a lower probe part and an elastic part, which are made in one body, by forming the lower probe part, which is shaped partly or wholly in cylindrical shape, from a plate of the planar figure of lower probe part using rolling means, winding the elastic part to surround an outside of the lower probe part, and making the upper probe part shaped partly or wholly in cylindrical shape, and c) hardening the raw pogo pin through heat treatment and plating the raw pogo pin.

In still another general aspect, there is provided a method for manufacturing a probe-connection-type pogo pin including an upper probe part, a lower probe part, and an elastic part positioned between the upper probe part and the lower probe part, the method comprising: a) cutting a metal plate according to planar figures represented on the metal plate, wherein the represented planar figures include a planar figure of upper probe part with a planar figure of tip portion formed on an upper end of the upper probe part, a planar figure of lower probe part with a planar figure of tip portion formed on a lower end of the lower probe part, and a planar figure of strip-shaped elastic part formed to connect the planar figure of upper probe part and the planar figure of lower probe part to each other, b) forming a raw pogo pin made of an upper probe part, a lower probe part and an elastic part, which are made in one bod, by forming the upper probe part and the lower probe part, which are shaped partly or wholly in cylindrical shape, from a plate of the planar figure of upper probe part and a plate of the planar figure of lower probe part, respectively, using rolling means, and winding the elastic part to surround an outside of the lower probe part, and c) hardening the raw pogo pin through heat treatment and plating the raw pogo pin.

The lower probe part may not be inserted into but spaced apart from the upper probe part when external force is not applied on the raw pogo pin.

The plating may be performed by plating the raw pogo pin with nickel and then with gold.

Advantageous Effects

According to embodiments of the present invention, it is possible to apply the pogo pin to highly integrated electronic parts and test equipment by eliminating an external body, which is used to surround a spring in a conventional pogo pin, to reduce the outside diameter of the pogo pin and thus reduce the interval between pogo pins.

Additionally, it is possible to reduce loss and distortion of an electrical signal by transmitting the electrical signal through the surface contact between the upper and lower probe parts.

Furthermore, it is possible to manufacture in large quantity at a significantly low cost through a simplified, unified manufacturing process.

MODE FOR THE INVENTION

The present invention provides a pogo pin including an upper probe part, a lower probe part, and an elastic part made of a spring, which is characterized in that a part of or a whole of each of the upper and lower probe parts is shaped in cylindrical shape and there is no additional body surrounding the elastic part.

Exemplary embodiments of the present invention will now be described in detail with reference to the accompanying drawings. Description of well-known structures may be omitted to enhance clarity and conciseness in the event that the description of well-known structures makes the technical idea of the present invention unclear or indefinite.

Figure 3A:
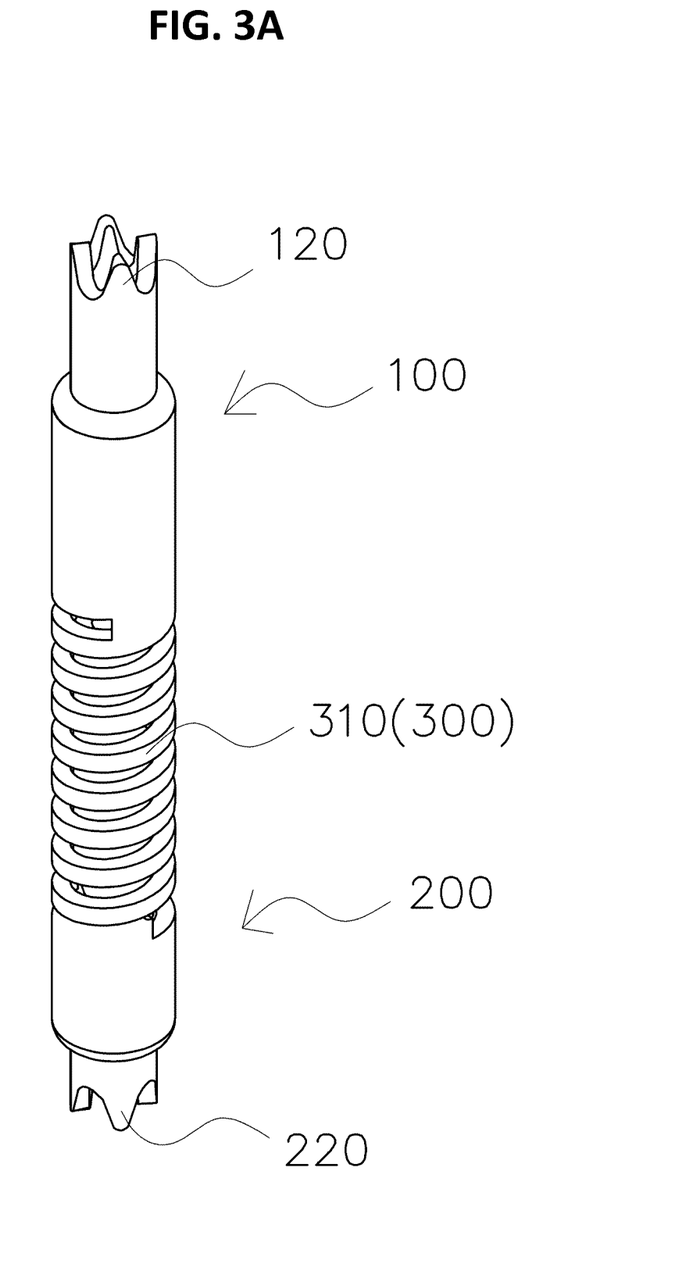
FIGS. 3A to 3B are a perspective view of and a development view of a pogo pin, respectively, according to an embodiment of the present invention.
Figure 4A:
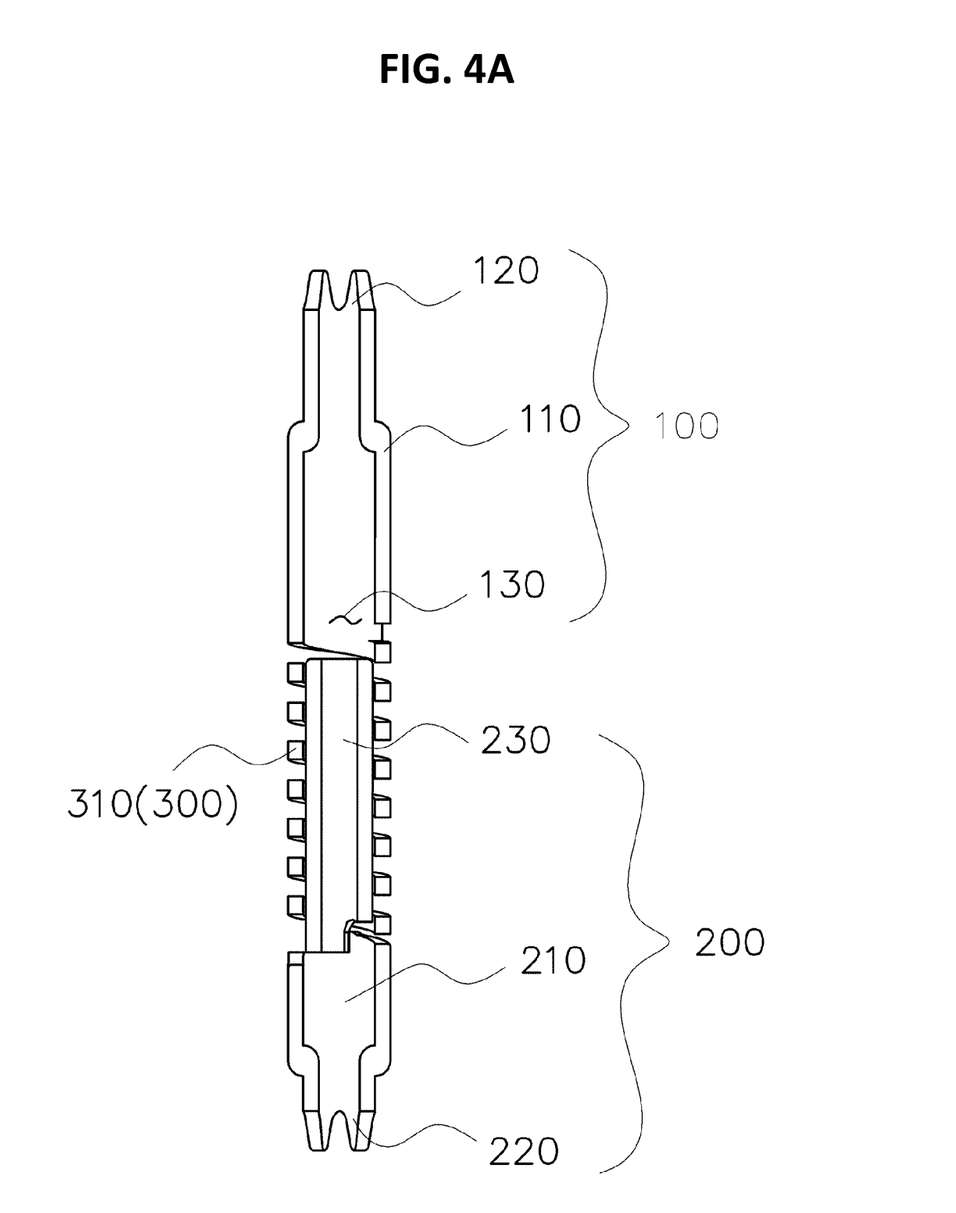
FIGS. 4A to 4B are cross-sectional views of a pogo pin before and after pressurization according to an embodiment of the present invention.

As shown in FIGS. 3A and 4A, a pogo pin includes an upper probe part 100, a lower probe part 200, and an elastic part 300 which is positioned between the upper probe part and the lower probe part. The pogo pin may be formed by separately making the upper probe part 100, the lower probe part 200, and the elastic part 300 and then combining them together. However, it is preferred that the pogo pin be formed by using a single unitary member in the following manner for simplifying the manufacturing process and facilitating the mass production.

Figure 3B:
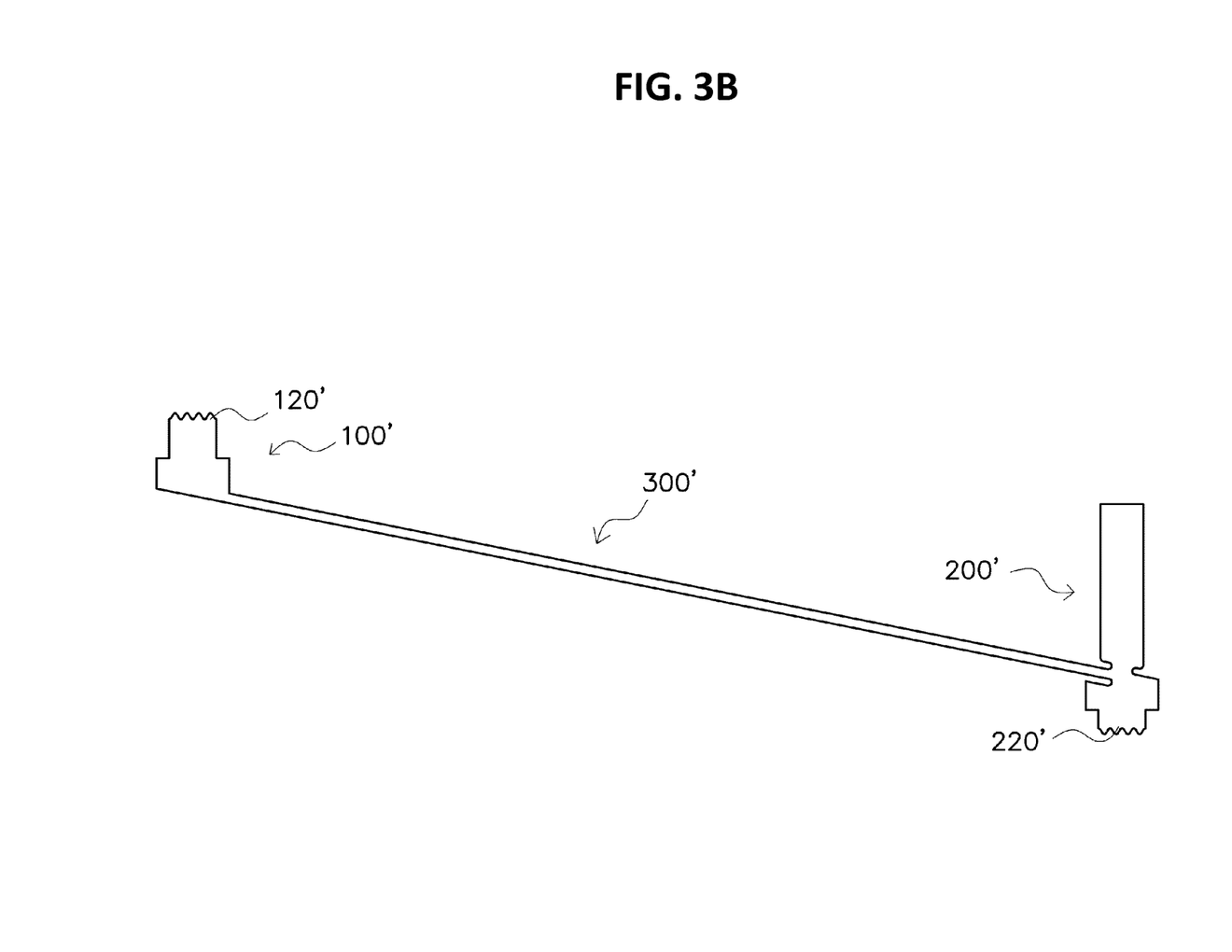

FIG. 3B illustrates a development view of the pogo pin according to an embodiment of the present invention. The pogo pin may be formed by cutting a single member made of thin plate along planar figures of the pogo pin as shown in the development view through a punching operation, and bending, rolling, roll bending, or winding the thin plate.

It is preferred that the single member made of thin plate be a conductive metal plate with a predetermined elongation property, an increased elasticity and strength through a heat treatment operation, and a low electrical resistance. Hence, beryllium copper alloy, particularly beryllium copper alloy 25, i.e., ASTM C17200, is preferred. However, the other material meeting mechanical and electrical properties may be used.

The upper probe part 100 includes a first body 110, and a tip portion 120, which is provided on an upper end of the first body 110. The first body includes a hollow cylindrical opening portion 130 on a lower end thereof. The lower probe part 200 includes a second body 210, a tip portion 220, which is provided on a lower end of the second body 210, and an insertion portion 230, which is provided on an upper end of the second body 210 and has a diameter enough to be inserted into the opening portion 130. The tip portions 120, 220 are positioned at both ends of the pogo pin to come in direct contact with test terminals, contact pads, etc. The tip portions 120, 220 may vary in shape; however, it is preferred that the tip portions 120, 220 be shaped in crown shape to come in accurate contact with the test terminal, etc.

As shown in FIG. 4A, the opening portion 130 and the insertion portion 230 are formed to be spaced apart from each other by a predetermined interval when external force is not applied on the following elastic part 300. In this case, since the pogo pin is formed in such a structure that the upper probe part 100 and the lower probe part 200 are connected to each other through the elastic part only, the upper and lower probes may be difficult to come in contact with each other when the opening portion 130 and the insertion portion 230 are too much spaced apart from each other. This may affect stability in the structure of the pogo pin. Hence, the opening portion 130 and the insertion portion 230 should be formed to not come in contact with each other but spaced from each other by a proper interval. The interval is intended to perform an accurate plating operation with a proper thickness on the entire surface of the upper and lower probe parts 100 and 200 when the pogo pin is plated. In other words, the interval is intended to prevent probable problems due to the plating, e.g., to prevent the plating from clumping between the opening portion 130 and the insertion portion 230, prevent a part of the surface from being not plated, or prevent the opening portion 130 and the insertion portion 230 from being brought into contact with each other due to the plating.

Figure 4B:
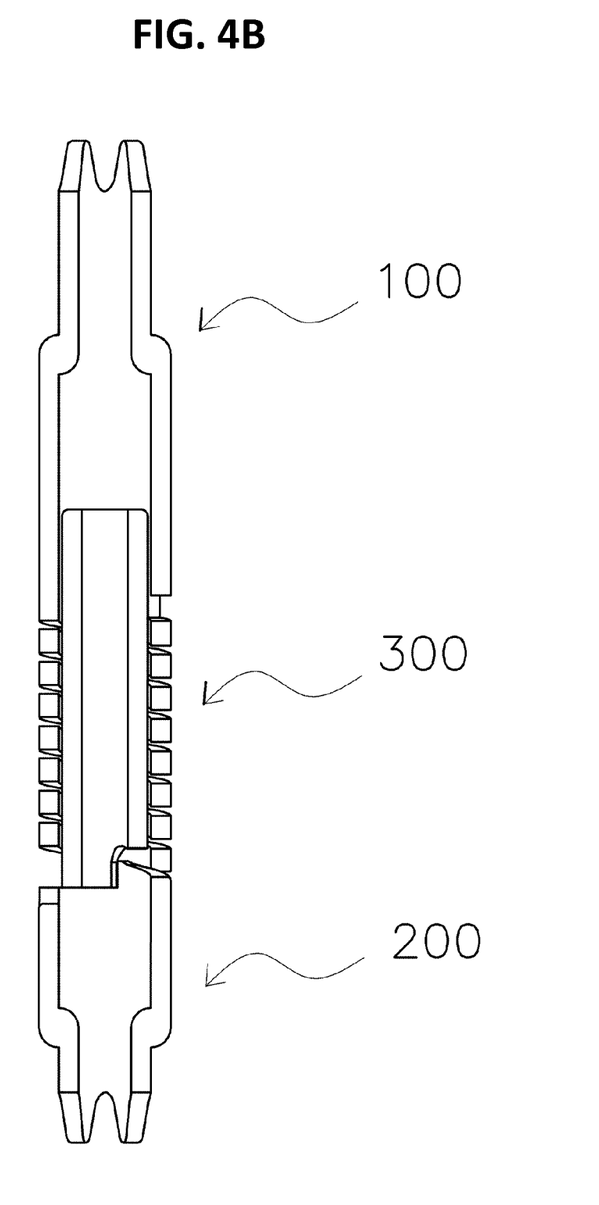

As shown in FIG. 4B, when external force is applied on the pogo pin, the upper probe part 100 and the lower probe part 200 come in contact with each other while the insertion portion 230 is inserted into the opening portion 130. Specifically, when external force is applied on the upper probe part 100 or the lower probe part 200, the external force is communicated to the upper probe part 100 or the lower probe part 200 and the elastic part 300. The external force causes the elastic part 300 to contract and causes the insertion portion 230, which is provided on the upper end of the second body, to be inserted into the hollow, cylindrical opening portion 130, which is provided on the lower end of the first body, so that the lower probe part 200 and the upper probe part 100 are brought into surface contact with each other. When the external force is applied no longer, the contracted elastic part 300 is elastically restored so that the upper probe part 100 and the lower probe part 200 are kept apart from each other as they were.

A conventional pogo pin is structured in such a manner that an upper probe and a cylindrical body are brought into contact with each other and the cylindrical body and a lower probe are also brought into contact with each other. In the present embodiment, however, it is only the upper probe part 100 and the lower probe part 200 that are brought into contact with each other. Furthermore, the conventional pogo pin is formed to have a small contact surface between the upper probe and the cylindrical body or between the cylindrical body and the lower probe. In the present embodiment, however, the pogo pin is formed to have a very large contact surface, thereby remarkably reducing the distortion of a transmitted electrical signal.

In the present embodiment, the lower probe part 200 and the upper probe part 100 include the insertion portion 230 and the hollow cylindrical opening portion 130, respectively. Accordingly, upon the application of external force, the upper probe part 100 and the lower probe part 200 are brought into contact with each other along the inner surface of the cylindrical opening portion 130.

Figure 5A:
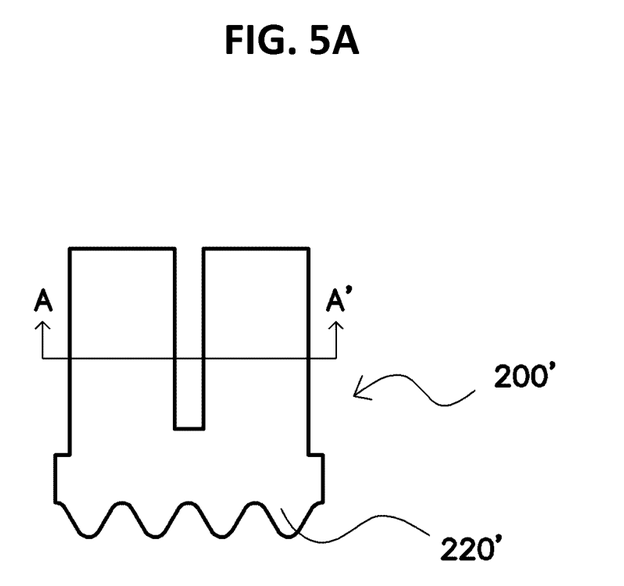
FIGS. 5A to 5B are a development view of a lower probe part of a pogo pin and a cross-sectional view of an insertion portion of the lower probe part as seen from the line A-A', respectively, according to another embodiment of the present invention.
Figure 5B:
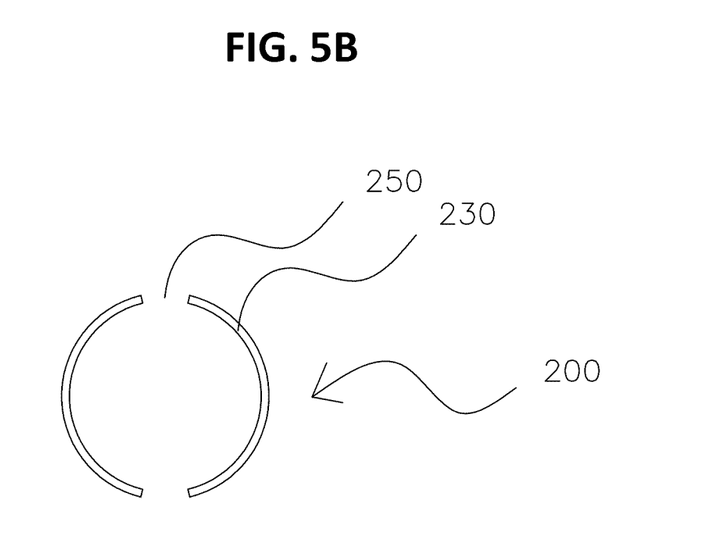

The insertion portion 230 is preferably shaped in cylinder shape, and may be a circle in section or a circle in section with one or more openings 250 as shown in FIG. 5B. When the insertion portion 230 is inserted into the opening portion 130, the openings 250 of the insertion portion 230 allow the diameter in section of the insertion portion 230 to be reduced so that the insertion portion 230 may be easily inserted into the opening portion 130. Furthermore, the openings 250 allow the insertion portion 230 and the opening portion 130 to be brought into secure contact with each other. The number of the openings 250 may be one or more. FIG. 5A is a development view of the lower probe part with the openings.

The elastic part 300, which is positioned between the upper probe part 100 and the lower probe part 200, is made of a spring which is formed to surround at least the outer surface of the insertion portion 230 with one end of the elastic part 300 fixed to a part of the lower portion of the lower probe part 200 and with the other end thereof fixed to the lower end of the upper probe part 100. The spring 310 has elasticity against the external force which is applied on the upper portion of the upper probe part 100 or the lower portion of the lower probe part 200.

In the present embodiment, the opening portion 130, which is provided on the lower end of the upper probe part 100, is shaped in a hollow cylinder shape, and one end of the spring is fixed to the lower end of the upper probe part 100. Hence, the spring may be maintained in a stable structure even though no additional structure is provided on the outside of the spring to control the movement of the spring.

In the present embodiment, since the spring 310 is formed to surround at least the outer surface of the insertion portion 230 with one end of the spring 310 fixed to a part of the lower portion of the lower probe part 200 and with the other end thereof fixed to the lower end of the upper probe part 100 and there is no extra structure to cover the outside of the spring, the outside diameter of the spring 310 may be considered the outside diameter of the pogo pin, resulting in a pogo pin with a smaller outside diameter compared to a case where the elastic part is positioned inside the body of a pogo pin.

The inside diameter of the spring 310 has to have a predetermined size or more so that the spring may have a predetermined elasticity. Accordingly, the insertion portion of the second body may be positioned in the middle of the spring.

The spring may be formed to surround the outer surface of the upper probe part 100 with the opening portion 130 formed therein. However, if the spring is formed to surround the outer surfaces of the upper probe part 100 and the lower probe part 200, the minimum outside diameter of the spring 310 becomes larger than the thickness of the upper probe part 100 with the opening portion formed therein, when compared to a case where the spring is not formed to surround the outer surface of the upper probe part 100. Hence, in order to decrease the outside diameter of the pogo pin, it is preferred that the upper probe part 100 be not positioned inside the spring.

Figure 6A:
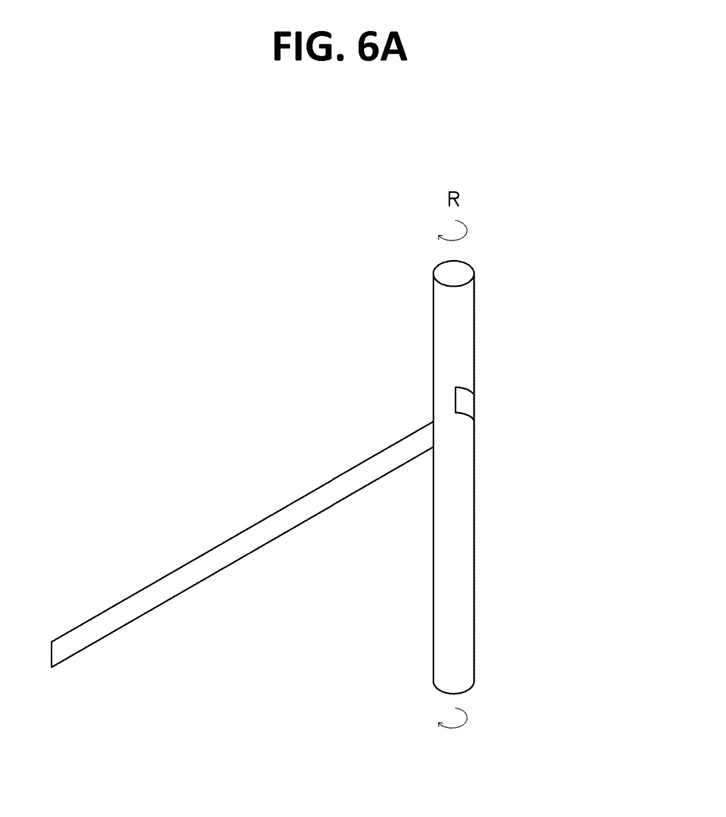
FIGS. 6A to 6C are development views of springs for pogo pins according to embodiments of the present invention.
Figure 6B:
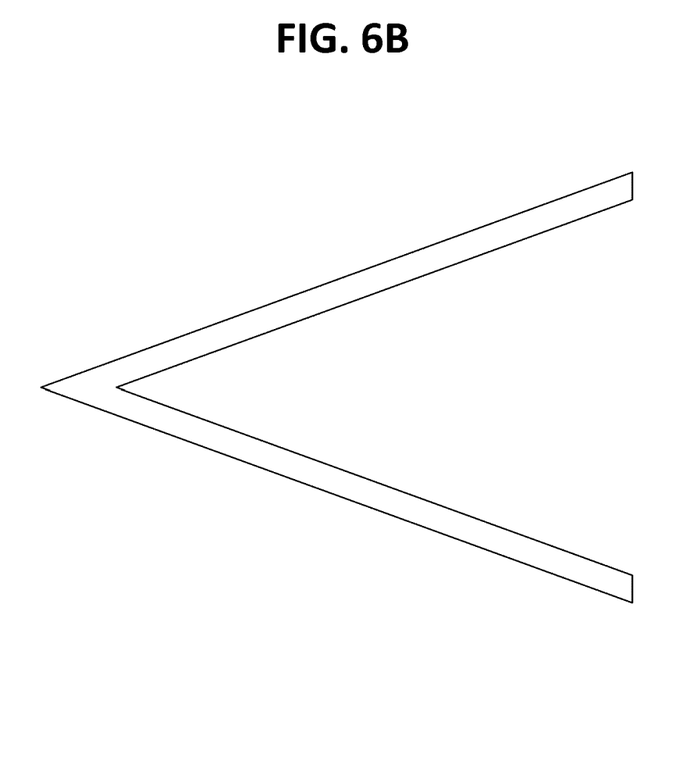
Figure 6C:
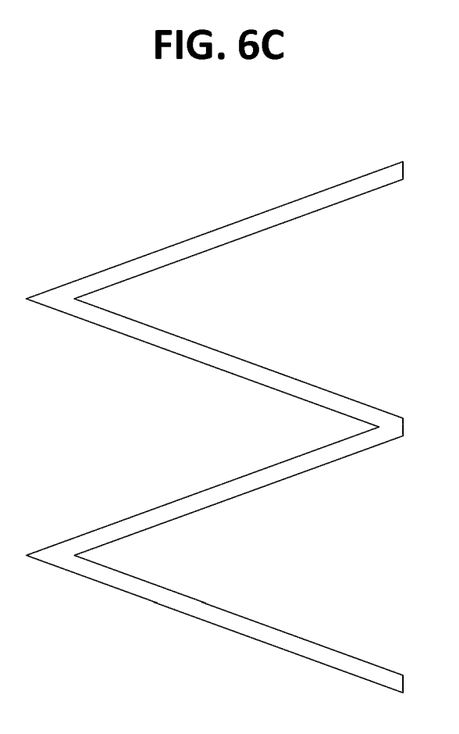

FIGS. 6A to 6C are development views of the elastic part 300 according to embodiments of the present invention. The spring 310 is formed using rolling means R, e.g., by rolling the plate using a tool, such as a bending roller, or by pressing the plate in a frame with a cylindrical through-hole formed inside thereof and winding the plate along the cylindrically curved surface of the frame.

As shown in FIGS. 6A to 6C, the plate used in forming the spring may be formed in a shape of I, V, W, or the like. However, the I-shaped plate is the most preferred due to a difference in change in the shape of the spring which is being pressurized when a pressure is applied on the spring. Specifically, when taking into account the structure of a spring formed using the rolling means R, the I-shaped spring is formed in such a manner that the upper and lower portions of the I-shaped spring are wound in the same direction, i.e., in one direction, thereby forming a one-directional spring. Hence, when the pressure is applied on the pogo pin, the I-shaped spring is pressurized moving forward. On the other hand, a V- or W-shaped plate is formed in such a manner that the upper and lower portions of the V- or W-shaped plate are wound in two different directions, thereby forming a two-directional spring. Hence, when the pressure is applied on the pogo pin, the spring may be warped since the spring may be pressurized leaning to one side in the vicinity of the middle of the spring. Furthermore, a spring made of the I-shaped plate has a longer elasticity-inducing segment compared to a spring made of the V- or W-shaped plate. Therefore, it is preferred to use a spring made of the I-shaped plate, which is wound in one direction, in terms of the stability and durability of the spring and the increased pressure range of the pogo pin.

Progressive stamping is a metalworking method that encompasses punching, coining, roll bending, bending, and rolling, combined with an automatic feeding system. In the present embodiment, the progressive stamping is employed to manufacture the pogo pin, thereby simplifying the manufacturing process, reducing the manufacturing cost, and facilitating the mass production.

Figure 7A:
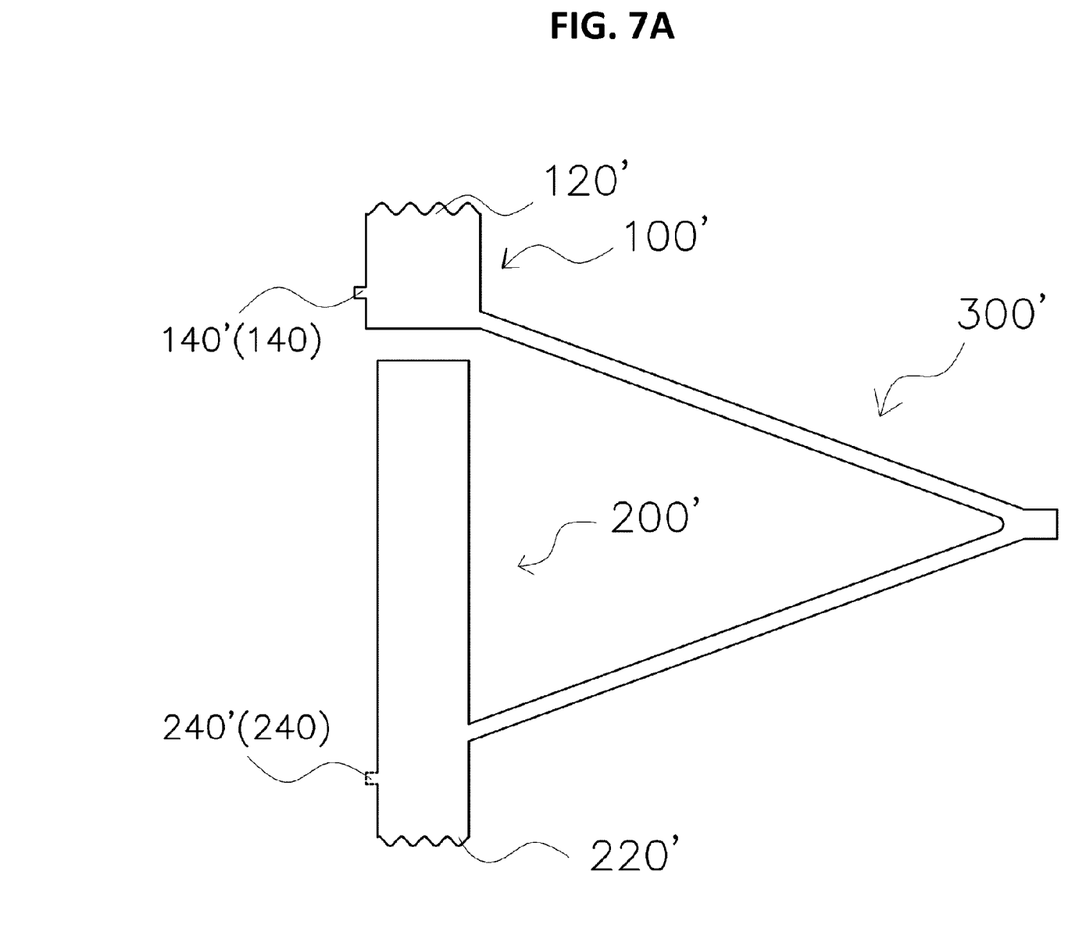
FIGS. 7A to 7B are a development view of and a perspective view of a pogo pin, respectively, according to another embodiment of the present invention.
Figure 7B:
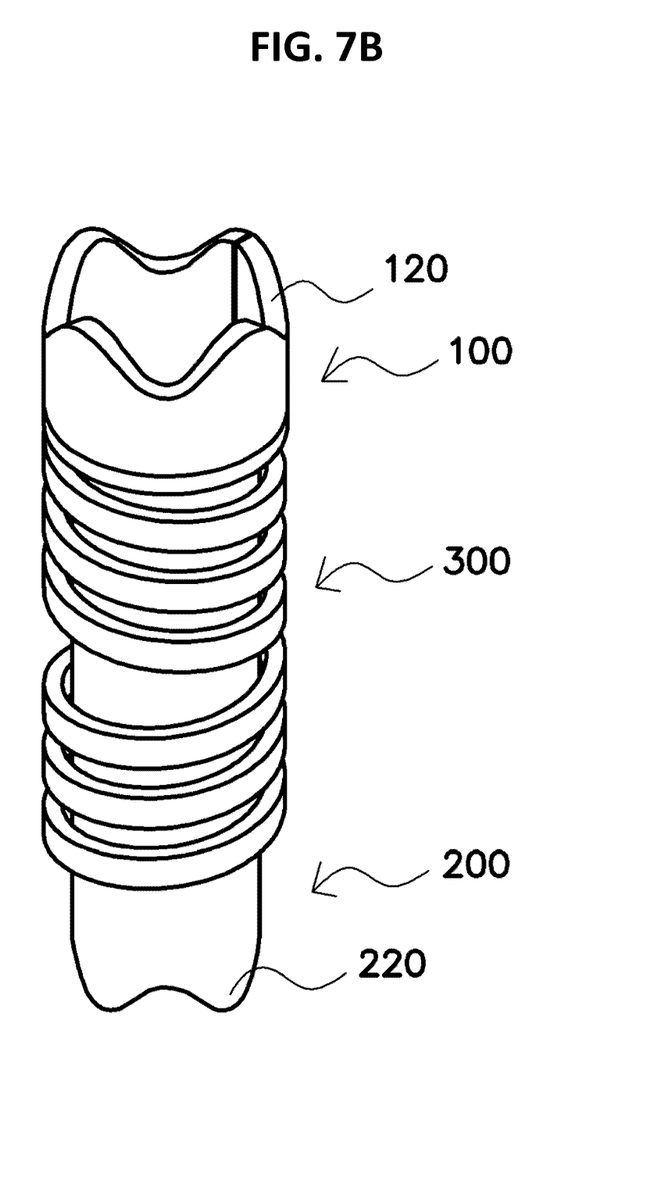

FIGS. 7A and 7B are a development view and a perspective view of a pogo pin, respectively, according to another embodiment of the present invention.

The upper probe 100 or the lower probe 200 may further include a fixing portion 140, 240. As shown in FIG. 7A, the fixing portion 140, 240 may be formed by bending a planar figure of fixing portion 140', 240' or by rolling or winding using a rolling means so that the pogo pin may be securely fixed to other structures such as test equipment. The fixing portion 140, 240 may be applied to a pogo pin according to another embodiment of the present invention.

As shown in FIG. 3B, a pogo pin with a spring made of an I-shaped plate is manufactured as follows:

a) Cutting (S1)

For a single metal plate where a planar figure of upper probe part 100' with a planar figure of tip portion 120' formed on an upper end of the planar figure of upper probe part, a planar figure of lower probe part 200' with a planar figure of tip portion 220' formed on a lower end of the planar figure of lower probe part, and a planar figure of strip-shaped elastic part 300' formed to connect the planar figure of upper probe 100' and the planar figure of lower probe part 220' to each other are represented, the single metal plate is cut according to the planar figures represented on the single metal plate. This cutting may be performed with a cutter. The cutting is preferably performed through a punching operation during the progressive stamping.

b) Forming Raw Pogo Pin (S2)

A raw pogo pin made of an upper probe part, a lower probe part, and an elastic part, which are made in one body, is formed by making the lower probe part shaped partly or wholly in cylindrical shape by using rolling means R to wind a plate of the planar figure of lower probe part 200' or by pressing the plate in a frame with a cylindrical through-hole formed inside thereof and winding the plate along the cylindrically curved surface of the frame, winding the elastic part 300 to surround the outer surface of the lower probe part 200, and making the upper probe part 100 shaped partly or wholly in cylindrical shape. The upper probe part 100 is formed partly or wholly in cylindrical shape from a plate of the planar figure of upper probe part 100' by using the rolling means R.

Referring to FIG. 3B, the raw pogo pin may be formed by winding the plate in a left direction from the right end of the planar figure of lower probe part 200' to the left end of the planar figure of upper probe part 100'. The raw pogo pin may be formed by first winding the planar figure of upper probe part 100' from left to right to form the upper probe part 100 and then sequentially winding the planar figure of lower probe part 200' and the planar figure of elastic part 300' in a left direction from the right end of the planar figure of lower probe part 200'. The raw pogo pin may be formed by first sequentially winding the planar figure of lower probe part 200' and the planar figure of elastic part 300' in a left direction from the right end of the planar figure of lower probe part 200' and then winding the planar figure of upper probe part 100' from left to right. This forming of the raw pogo pin is preferably performed through at least one of rolling, bending and roll bending operations during the progressive stamping.

c) Heat Treatment and Plating (S3)

The pogo pin is completed by hardening the raw pogo pin through heat treatment to improve elasticity and strength and performing nickel and gold plating.

The plating is performed to improve properties of the raw pogo pin, e.g., to lower electrical resistance. It is preferred that material with a low electrical resistance, such as gold, be used. Instead of plating gold on the surface of the raw pogo pin, however, it is more preferred that nickel underlayer coating be first performed and then gold be plated thereon. In this case, the nickel underlayer coating allows the gold to be plated thinner, reduces air pockets on the surface of copper alloy as base metal to prevent corrosion of the surface of copper alloy, and causes increased wear resistance of gold.

Furthermore, the plating is performed after forming and hardening the raw pogo pin through heat treatment. The plating may be performed on the metal plate before cutting or forming the raw pogo pin. In this case, however, when the metal plate is wound by a roller during the cutting operation or the forming operation of the raw pogo pin, the plated material may be damaged into a defective product. Besides, the plating may change properties of material, which makes it difficult to use the rolling means to form the raw pogo pin. As described earlier, since the opening portion and the insertion portion are spaced apart from each other by a proper interval, there hardly exists non-plated area although the plating is directly performed on the raw pogo pin. Accordingly, the plating is preferably performed after forming the raw pogo pin.

As shown in FIG. 7A, a pogo pin with a spring made of a V- or W-shaped plate is manufactured as follows:

a) Cutting (S1')

For a single metal plate where a planar figure of upper probe part 100' with a planar figure of tip portion 120' formed on an upper end of the planar figure of upper probe part, a planar figure of lower probe part 200' with a planar figure of tip portion 220' formed on a lower end of the planar figure of lower probe part, and a planar figure of strip-shaped elastic part 300' formed to connect the planar figure of upper probe 100' and the planar figure of lower probe part 220' to each other are represented, the single metal plate is cut according to the planar figures represented on the single metal plate. This cutting may be performed with a cutter. The cutting is preferably performed through a punching operation during the progressive stamping.

b) Forming Raw Pogo Pin (S2')

A raw pogo pin made of an upper probe part, a lower probe part, and an elastic part, which are made in one body, is formed by making the upper probe part and the lower probe part each shaped partly or wholly in cylindrical shape by using rolling means R to wind a plate of the planar figure of upper probe part 100' and a plate of the planar figure of lower probe part 200' or by pressing each plate in a frame with a cylindrical through-hole formed inside thereof and winding each plate along the cylindrically curved surface of the frame, and winding the elastic part 300 to surround the outer surface of the cylindrical lower probe part 200. The forming of the raw pogo pin is preferably performed through at least one of rolling, bending and roll bending operations during the progressive stamping.

c) Heat Treatment and Plating (S3')

The pogo pin is completed by hardening the raw pogo pin through heat treatment to improve elasticity and strength and performing nickel and gold plating.

In the embodiments of the present invention, the terms 'the upper and lower probe parts' are designated as shown in the drawings for purposes of explanation of the pogo pin. However, the pogo pin may be used in any positions and in any orientations. In other words, the upper probe part may be used facing upward to correspond to external terminals of a semiconductor package, or used facing downward to correspond to contact pads of a test board.

A number of embodiments have been described above. Nevertheless, the description of the embodiments is for illustrative purposes only to assist the reader in gaining a comprehensive understanding of the invention. Accordingly, it will be understood that various changes and modifications may be made to the embodiments without departing from the scope of the invention and fall within the scope of the following claims.

The invention claimed is:

1. A probe-connection-type pogo pin including an upper probe part (100), a lower probe part (200), and an elastic part (300) positioned between the upper probe part and the lower probe part, wherein the upper probe part and the lower probe part are connected to each other through the elastic part only,
   a) wherein the upper probe part (100) comprises a first body (110) and a tip portion (120) provided on an upper end of the first body (110), the first body including a hollow cylindrical opening portion (130) on a lower end thereof,
   b) wherein the lower probe part (200) comprises a second body (210), a tip portion (220) provided on a lower end of the second body (210), and an insertion portion (230) provided on an upper end of the second body (210) and having a diameter enough to be inserted into the opening portion (130), and
   c) wherein the elastic part (300) is a spring (310) which has a predetermined elasticity and formed to surround at least an outside of the insertion portion (230) with one end of the spring fixed to a lower side of the lower probe part (200) and with another end of the spring fixed to a lower end of the upper probe part (100),
   wherein the insertion portion of the second body may be positioned in the middle of the spring, and
   wherein the spring has an electrical path in proportion to the number of turns of the spring and has a spiral structure of a coil causing resistance and inductance components.

2. The probe-connection-type pogo pin of claim 1, wherein the insertion portion (230) is circular or a circle with at least one opening (250) when viewed in cross section.

3. The probe-connection-type pogo pin of claim 1, wherein the spring (310) is a one-directional spring which is only wound in one direction.

4. The probe-connection-type pogo pin of claim 1, wherein the spring (310) is a two-directional spring whose upper and lower portions are wound in different directions to each other.

5. The probe-connection-type pogo pin of claim 1, wherein the upper probe part (100) or the lower probe part (200) further comprises a fixing portion (140, 240).

6. The probe-connection-type pogo pin of claim 1, wherein the upper probe part (100), the lower probe part (200), and the elastic part (300) are made in one body.

7. The probe-connection-type pogo pin of claim 6, wherein the opening portion (130) and the insertion portion (230) are spaced apart from each other when external force is not applied on the elastic part (300).

8. A method for manufacturing a probe-connection-type pogo pin including an upper probe part (100), a lower probe part (200'), and an elastic part (300) positioned between the upper probe part and the lower probe part, wherein the upper probe part and the lower probe part are connected to each other through the elastic part only, the method comprising:
   a) cutting a metal plate according to planar figures represented on the metal plate, wherein the represented planar figures include a planar figure of upper probe part (100') with a planar figure of tip portion (120') formed on an upper end of the planar figure of upper probe part, a planar figure of lower probe part (200') with a planar figure of tip portion (220') formed on a lower end of the planar figure of lower probe part, and a planar figure of strip-shaped elastic part (300') formed to connect the planar figure of upper probe part (100') and the planar figure of lower probe part (200') to each other, b) forming a raw pogo pin made of an upper probe part, a lower probe part and an elastic part, which are made in one body, by forming the lower probe part (200'), which is shaped partly or wholly in cylindrical shape, from a plate of the planar figure of lower probe part (200') using rolling means, winding the elastic part (300) to surround an outside of the lower probe part (200'), and making the upper probe part (100) shaped partly or wholly in cylindrical shape, and c) hardening the raw pogo pin through heat treatment and plating the raw pogo pin, and wherein the probe-connection-type pogo pin further includes a spring which has a predetermined elasticity, wherein the lower probe part (200') includes an insertion portion which may be positioned in the middle of the spring, and wherein the spring has an electrical path in proportion to the number of turns of the spring and has a spiral structure of a coil causing resistance and inductance components.

9. A method for manufacturing a probe-connection-type pogo pin including an upper probe part (100), a lower probe part (200'), and an elastic part (300) positioned between the upper probe part and the lower probe part, wherein the upper probe part and the lower probe part are connected to each other through the elastic part only, the method comprising:

a) cutting a metal plate according to planar figures represented on the metal plate, wherein the represented planar figures include a planar figure of upper probe part (100') with a planar figure of tip portion (120') formed on an upper end of the planar figure of upper probe part, a planar figure of lower probe part (200') with a planar figure of tip portion (220') formed on a lower end of the planar figure of lower probe part, and a planar figure of strip-shaped elastic part (300') formed to connect the planar figure of upper probe part (100') and the planar figure of lower probe part (200') to each other, b) forming a raw pogo pin made of an upper probe part, a lower probe part and an elastic part, which are made in one body, by forming the upper probe part (100) and the lower probe part (200), which are shaped partly or wholly in cylindrical shape, from a plate of the planar figure of upper probe part (100') and a plate of the planar figure of lower probe part (200'), respectively, using rolling means, and winding the elastic part (300) to surround an outside of the lower probe part (200), and c) hardening the raw pogo pin through heat treatment and plating the raw pogo pin, wherein the probe-connection-type pogo pin further includes a spring which has a predetermined elasticity, wherein the lower probe part (200') includes an insertion portion which may be positioned in the middle of the spring, and wherein the spring has an electrical path in proportion to the number of turns of the spring and has a spiral structure of a coil causing resistance and inductance components.

10. The method of claim 8, wherein the lower probe part (200) is not inserted into but spaced apart from the upper probe part (100) when external force is not applied on the raw pogo pin.

11. The method of claim 8, wherein the plating is performed by plating the raw pogo pin with nickel and then with gold.

* * * * *